US011211589B2

(12) United States Patent
Kristal

(10) Patent No.: US 11,211,589 B2
(45) Date of Patent: Dec. 28, 2021

(54) DISPLAY PANEL WITH REFRACTIVE FILM LAYERS, MANUFACTURING METHOD THEREOF, AND DISPLAY APPARATUS WITH REFRACTIVE FILM LAYERS

(71) Applicant: BOE TECHNOLOGY GROUP CO., LTD., Beijing (CN)

(72) Inventor: Boris Kristal, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 849 days.

(21) Appl. No.: 15/777,669

(22) PCT Filed: Dec. 13, 2017

(86) PCT No.: PCT/CN2017/115937
§ 371 (c)(1),
(2) Date: May 20, 2018

(87) PCT Pub. No.: WO2018/205600
PCT Pub. Date: Nov. 15, 2018

(65) Prior Publication Data
US 2021/0184177 A1   Jun. 17, 2021

(30) Foreign Application Priority Data
May 11, 2017   (CN) .......................... 201710329599.7

(51) Int. Cl.
*H01L 27/15*   (2006.01)
*H01L 51/52*   (2006.01)
*H01L 51/56*   (2006.01)

(52) U.S. Cl.
CPC .......... *H01L 51/5275* (2013.01); *H01L 51/56* (2013.01)

(58) Field of Classification Search
CPC .. H01L 51/5175; H01L 51/56; H01L 51/5271
See application file for complete search history.

(56) References Cited

U.S. PATENT DOCUMENTS 7,888,866 B2 * 2/2011 Maeda ................ H01L 51/5275
313/506
9,543,547 B2   1/2017 Yang et al.
(Continued)

FOREIGN PATENT DOCUMENTS

CN   102439488 A   5/2012
CN   103633256 A   3/2014
(Continued)

OTHER PUBLICATIONS

1st Office Action dated Mar. 20, 2019 in CN201710329599.7.
International Search Report and Written Opinion dated Mar. 12, 2018 in PCT/CN2017/115937.
The 4th CN Office Action dated Sep. 2, 2020 in CN201710329599.7.
(Continued)

*Primary Examiner* — Phuc T Dang
(74) *Attorney, Agent, or Firm* — Syncoda LLC; Feng Ma

(57) ABSTRACT

A display panel includes a substrate, a first electrode, a light-emitting layer, a second electrode, and one or more refractive film layers. The first electrode, the light-emitting layer, and the second electrode are sequentially disposed over the substrate. The substrate, the first electrode, and the one or more refractive film layers are configured to provide a stepwise graded refractive index along a transmission direction of lights emitted from the light-emitting layer and transmitted therethrough to thereby cause an improved outcoupling of the lights. The one or more refractive film layers may optionally include a first refractive film layer disposed on a surface of the substrate proximate to the first electrode, and may optionally include a second refractive film layer disposed on a surface of the substrate distal to the first electrode.

20 Claims, 10 Drawing Sheets

(56) References Cited

U.S. PATENT DOCUMENTS

| | | | |
|---|---|---|---|
| 2002/0094422 | A1 | 7/2002 | Tsai et al. |
| 2004/0160171 | A1 | 8/2004 | Takahashi |
| 2011/0140151 | A1* | 6/2011 | Lee .................... H01L 51/5281 257/98 |
| 2014/0168778 | A1 | 6/2014 | Chen et al. |
| 2015/0268394 | A1* | 9/2015 | Uchiyama ............ G02B 3/0087 359/653 |
| 2015/0303405 | A1* | 10/2015 | Okumura ............ H01L 51/5203 257/40 |

FOREIGN PATENT DOCUMENTS

| | | |
|---|---|---|
| CN | 103682125 A | 3/2014 |
| CN | 103633256 B | 5/2016 |
| JP | 2010176928 A | 8/2010 |
| JP | 2014518439 A | 7/2014 |
| WO | 2016177448 A1 | 11/2016 |

OTHER PUBLICATIONS

IPI Office Action in Application No. 201827028331, dated Mar. 18, 2020.
Chang Chih-Hao et al: "Improving the efficiency of white OLEDs based on a gradient refractive index substrate", 2015 22ND International Workshop on Active-Matrix Flatpanel Displays and Devices (AM-FPD'15), JSAP, Jul. 1, 2015, pp. 73-76, XP033185618.
Extended European Search Report in Application No. 17875079.0, dated Jan. 13, 2021.

\* cited by examiner

DISPLAY PANEL WITH REFRACTIVE FILM LAYERS, MANUFACTURING METHOD THEREOF, AND DISPLAY APPARATUS WITH REFRACTIVE FILM LAYERS

CROSS-REFERENCE TO RELATED APPLICATION

The present application claims priority to Chinese Patent Application No. 201710329599.7, filed on May 11, 2017, the disclosure of which is hereby incorporated by reference in its entirety.

TECHNICAL FIELD

The present disclosure is related generally to display technologies, and is more specifically to a display panel, a manufacturing method thereof, and a display apparatus containing the display panel.

BACKGROUND

The organic light-emitting diodes (OLEDs) display and quantum dots-based electro-luminescent display (QLEDs) are two-types of self-emitting display, due to their technological advantages over the traditional liquid crystal display (LCD) display, such as no need for back light, having good temperature characteristics, low power consumption, fast response, being flexible/bendable, light weight, being ultra-thin, high luminous efficiency, and wide viewing angle, have been two hot areas of research, and have received attention as next generation display.

Both an OLED display and a QLED display include a plurality of pixels to display an image. Each pixel includes an anode, a plurality of organic and inorganic layers, which include a light-emitting layer, and a cathode.

In a QLED display the light-emitting layer includes a plurality of organic and inorganic sub-layers, including a quantum dot emission layer. In the case where the anode and the cathode provide holes and electrons to the quantum dot emission layer to form an exciton, and light of a predetermined wavelength is formed while exciton falls to a stable bottom state. Herein, lights having wavelengths corresponding to red, green, and blue colors may be formed according to a material characteristic of the organic emission layer.

Both OLEDs and QLEDs can have three different configurations depending on the direction of light emission in the display panel: a bottom-emitting display panel, where lights from the light-emitting layer emit out through a substrate, a top-emitting display panel, where lights from the light-emitting layer emit out through a top layer opposing to the substrate, and a double-emitting type display panel, where lights from the light-emitting layer emit out from both the substrate and the top layer.

Specifically, in an OLED display or a QLED display, the plurality of pixels is formed on a substrate that may be made of glass, plastic or metal. In case of glass and plastic substrates, the top-emission configuration, the bottom-emission configuration, and the double-emission configuration are possible, while metal substrate typically allows only for top-emission configuration.

The term bottom emission or alike refers to a display device having a transparent bottom electrode (that which is the closest to the substrate) and a reflective top electrode (that which is the furthest from the substrate). In this configuration light is being emitted through the substrate to the outside. The term top emission refers to a display device having a reflective bottom electrode (that which is the closest to the substrate) and a semi-transparent top electrode (that which is the furthest from the substrate); in this configuration light is being emitted through the semi-transparent electrode to the outside.

It has been shown that despite the configurations as mentioned above, only a small portion of the generated light can be extracted from the conventional OLED/QLED display panel. For example, it is estimated that only about 20% of the generated light can be extracted from the conventional planar QLED that do not contain any specific outcoupling structures.

SUMMARY

The present disclosure provides a display panel, its manufacturing method, and a display apparatus containing the display panel, aiming to address the issue of relatively low external quantum efficiency associated with current OLED display apparatuses.

In a first aspect, a display panel is disclosed. The display panel comprises a substrate, a first electrode, a light-emitting layer, a second electrode, and one or more refractive film layers.

The first electrode, the light-emitting layer, and the second electrode are sequentially disposed over the substrate. The substrate, the first electrode, and the one or more refractive film layers are configured to provide a stepwise graded refractive index along a transmission direction of lights emitted from the light-emitting layer and transmitted therethrough to thereby cause an improved outcoupling of the lights.

According to some embodiments of the display panel, the one or more refractive film layers comprise a first refractive film layer disposed on a surface of the substrate proximate to the first electrode.

According to some other embodiments of the display panel, the one or more refractive film layers comprise a second refractive film layer disposed on a surface of the substrate distal to the first electrode.

According to yet some other embodiments of the display panel, the one or more refractive film layers comprise a first refractive film layer disposed on a surface of the substrate approximate to the first electrode, and a second refractive film layer disposed on a surface of the substrate distal to the first electrode.

In the display panel, it can be arranged such that at least one of the one or more refractive film layers comprises one or more refractive sub-layers, which are stacked over one another and configured to have a stepwise graded refractive index; or alternatively, it can be configured such that at least one of the one or more refractive film layers is configured to have a continuously altering gradient of refractive index.

According to some embodiments of the display panel, the one or more refractive film layers comprise a first refractive film layer disposed on a surface of the substrate proximate to the first electrode. The first electrode comprises a transparent electrode having a refractive index of about 1.8, the substrate comprises a glass having a refractive index of about 1.5; and the first refractive film layer has a refractive index of about 1.5-1.8.

In the embodiments of the display panel as described above, the first refractive film layer can comprise a polymer material, which can include at least one of polyamideimide, polydimethyl siloxane, or polyethylene naphthalate.

Alternatively, in the embodiments of the display panel as described above, the first refractive film layer can comprise a composite material, which can have a composition of optical silicone embedded with nanoparticles. Herein the nanoparticles can comprise $TiO_2$ nanoparticles, having a weight percentage of about 1-5% in the composite material.

According to some embodiments of the display panel, the one or more refractive film layers comprise a first refractive film layer disposed on a surface of the substrate approximate to the first electrode, and a second refractive film layer disposed on a surface of the substrate distal to the first electrode. The first refractive film layer comprises a first refractive sub-layer and a second refractive sub-layer, arranged to be next to the substrate and to the first electrode, respectively. The first refractive sub-layer comprises an optical silicone embedded with $TiO_2$ nanoparticles having a weight percentage of about 1-2%. The second refractive sub-layer can include at least one of polydimethyl siloxane or polyethylene naphthalate, or can an optical silicone embedded with $TiO_2$ nanoparticles having a weight percentage of about 2-5%.

According to some embodiments of the display panel, the first refractive film layer includes a microlens array, which comprises a plurality of microlenses, each configured to have a convex direction towards the substrate to allow focusing of lights transmitting therethrough.

According to some other embodiments of the display panel, the one or more refractive film layers comprise a second refractive film layer disposed on a surface of the substrate distal to the first electrode. The substrate comprises a glass having refractive index of about 1.5. The second refractive film layer has a refractive index below about 1.5 and higher than a refractive index of a medium. Herein the medium can be air having a refractive index of about 1.0. The second refractive film layer comprises at least one oblique-angle-deposited $SiO_2$ film layer having a deposition angle of about 0-85°.

In the display panel as described above, the second refractive film layer can consist of one oblique-angle-deposited $SiO_2$ film layer, which is configured to have a continuously increasing deposition angle from 20° to 80° along the transmission direction of lights.

Alternatively, the second refractive film layer can comprise a plurality of oblique-angle-deposited $SiO_2$ film layers, which are stacked over one another, and are configured such that any one oblique-angle-deposited $SiO_2$ film layer has a smaller deposition angle than an adjacent oblique-angle-deposited $SiO_2$ film layer along the transmission direction of lights. According to some specific embodiment, the plurality of oblique-angle-deposited $SiO_2$ film layers can include, along the transmission direction of lights, a first oblique-angle-deposited $SiO_2$ film layer having a deposition angle of about 54° and a second oblique-angle-deposited $SiO_2$ film layer having a deposition angle of about 78°.

In any embodiment of the display panel as described above, the light-emitting layer can include an OLED emitting stack or a QLED emitting stack.

In any embodiment of the display panel as described above, the second electrode can be a metal electrode, which is configured to have a reflective surface closer to the substrate.

In any embodiment of the display panel as described above, the second electrode can be a transparent electrode.

In a second aspect, the disclosure further provides a display apparatus, which includes a display panel according to any of the embodiments as described above.

In a third aspect, a method for manufacturing a display panel is disclosed. The method comprises the following steps:

providing a substrate;
forming a first electrode over the substrate;
forming a light-emitting layer over the first electrode; and
forming a second electrode over the light-emitting layer.
The method further comprises a step of:
forming one or more refractive film layers, such that the substrate, the first electrode, and the one or more refractive film layers provide a stepwise graded refractive index along a transmission direction of lights emitted from the light-emitting layer and transmitted therethrough to thereby cause an improved outcoupling of the lights.

According to some embodiments of the method, the forming one or more refractive film layers includes:

forming a first refractive film layer on a surface of the substrate proximate to the first electrode prior to the forming a first electrode over the substrate, such that the first electrode, the first refractive film layer and the substrate provide a stepwise decreasing refractive index along the transmission direction of the lights emitted from the light-emitting layer.

In the method as described above, the first electrode comprises a transparent electrode having refractive index of about 1.8, the substrate comprises a glass having refractive index of about 1.5. As such, the forming a first refractive film layer on a surface of the substrate proximate to the first electrode comprises:

forming a polymer material on the surface of the substrate proximate to the first electrode, wherein the polymer material has a refractive index of about 1.5-1.8.

Alternatively, the forming a first refractive film layer on a surface of the substrate proximate to the first electrode comprises:

forming a composite material on the surface of the substrate proximate to the first electrode, wherein the composite material comprises optical silicone embedded with $TiO_2$ nanoparticles having a weight percentage of about 1-5% in the composite material.

According to some other embodiments of the method, the forming one or more refractive film layers includes:

forming a second refractive film layer on a surface of the substrate distal to the first electrode, such that the first electrode, the substrate and the second refractive film layer provide a stepwise decreasing refractive index along the transmission direction of the lights emitted from the light-emitting layer.

Herein, the substrate can comprise a glass having refractive index of about 1.5, and the forming a second refractive film layer on a surface of the substrate distal to the first electrode comprises:

forming at least one oblique-angle-deposited $SiO_2$ film layer on the surface of the substrate distal to the first electrode, wherein each of the at least one oblique-angle-deposited SiO2 film layer has a deposition angle of about 0-85°.

As such, the forming at least one oblique-angle-deposited $SiO_2$ film layer on the surface of the substrate distal to the first electrode comprises:

forming one oblique-angle-deposited $SiO_2$ film layer having a continuously increasing deposition angle from 20° to 80° along the transmission direction of lights.

Alternatively, the forming at least one oblique-angle-deposited $SiO_2$ film layer on the surface of the substrate distal to the first electrode comprises:

forming each of a plurality of oblique-angle-deposited $SiO_2$ film layers sequentially on the surface of the substrate distal to the first electrode, such that any oblique-angle-deposited $SiO_2$ film layer has a smaller deposition angle than an adjacent oblique-angle-deposited SiO$_2$ film layer along the transmission direction of lights.

According to some specific embodiment of the method as described above, the forming each of a plurality of oblique-angle-deposited SiO2 film layers sequentially on the surface of the substrate distal to the first electrode comprises:

forming a first oblique-angle-deposited SiO$_2$ film layer having a deposition angle of about 54° on the surface of the substrate distal to the first electrode; and forming a second oblique-angle-deposited SiO$_2$ film layer having a deposition angle of about 78° on the first oblique-angle-deposited SiO$_2$ film layer.

Other embodiments of the disclosure may become obvious in light the descriptions as set forth above.

Throughout the disclosure, the term "about" or "around", or the sign "~" generally refers to plus or minus 10% of the indicated number. For example, "about 20" may indicate a range of 18 to 22, and "about 1" may mean from 0.9-1.1. Other meanings of "about" may be apparent from the context, such as rounding off, so, for example "about 1" may also mean from 0.5 to 1.4.

BRIEF DESCRIPTION OF THE DRAWINGS

To more clearly illustrate some of the embodiments, the following is a brief description of the drawings. The drawings in the following descriptions are only illustrative of some embodiment. For those of ordinary skill in the art, other drawings of other embodiments can become apparent based on these drawings.

DETAILED DESCRIPTION

Figure 1:
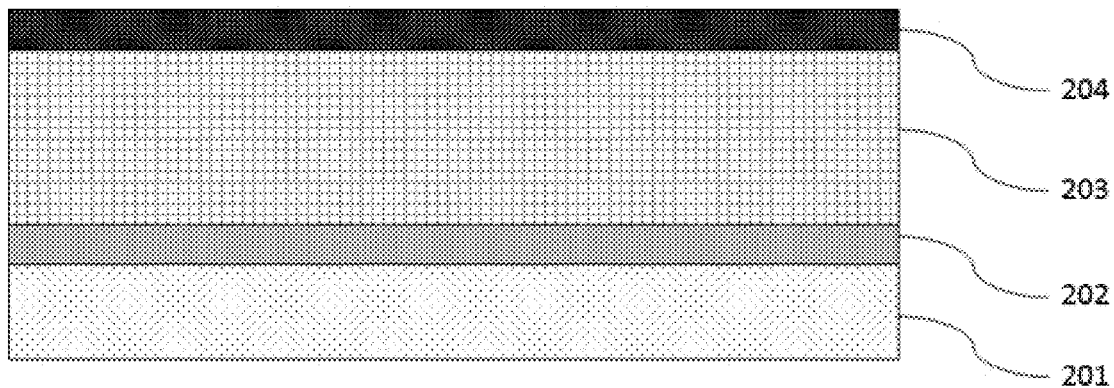
FIG. 1 is a structural diagram of a bottom-emitting QLED display panel according to a conventional technology.

In the following, with reference to the drawings of various embodiments disclosed herein, the technical solutions of the embodiments of the disclosure will be described in a clear and fully understandable way.

It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Studies have shown that the losses of light output associated with light outcoupling can be attributed to reflection of the emitted light at the various interfaces inside the device followed by reabsorption and thermalization. Specifically, for a bottom-emitting and a double-emitting display panel, key factors that influence the extraction of lights of the display panel include a substrate effect, a waveguide effect, a surface plasma polarization (SPP) effect, and an absorption effect.

Among the four factors, the substrate effect refers to an observation that a total internal reflection of light generated inside the display panel occurs on a substrate-air interface (such as a glass-air interface), resulting in a loss of light extraction. The waveguide effect refers to an observation that a total internal reflection of light generated inside the display panel occurs on a transparent electrode-substrate (such as an ITO-glass interface), also resulting in a loss of light extraction.

Herein the present disclosure provides a display panel, its manufacturing method, and a display apparatus containing the display panel, aiming to address the above mentioned issues of the substrate effect and the waveguide effect commonly associated with a bottom-emitting and a double-emitting display panel.

The technical solution provided in the disclosure can reduce losses of lights generated inside the display panel due to the substrate effect and the waveguide effect, increase light outcoupling, and improve the light output efficiency for the current bottom-emitting and double-emitting OLED/QLED display apparatuses.

The present disclosure provides a display panel. The display panel includes a substrate layer, and a display assembly that is disposed over the substrate layer. The display assembly includes, in a direction from closer to the substrate layer to farther away from the substrate layer, a first electrode, a light-emitting layer, and a second electrode.

Herein the first electrode and the second electrode can be respectively an anode and a cathode, but can also be respectively a cathode and an anode. The light-emitting layer can comprise an OLED emitting stack or a QLED emitting stack, as such, the display panel can correspondingly be an OLED display panel, or a QLED display panel, respectively.

According to some embodiments, the display panel is a bottom-emitting display panel, and the substrate layer and the first electrode are each configured to be transparent, the second electrode is configured to have a reflective surface thereof that is closer to the substrate layer.

As such, the lights generated by and emitted from the light-emitting layer can directly transmit through the first electrode and the substrate layer to reach an outside of the substrate layer of the display panel, or the lights can be reflected by the reflective surface of the second electrode before transmitting through the first electrode and the substrate layer to reach the outside of the substrate layer of the display panel. Thereby the bottom-emission can be realized for the display panel.

Herein the substrate layer can comprise a glass, or a transparent plastic (e.g. polyethylene terephthalate), the first electrode can comprise a transparent electrode, such as indium tin oxide (ITO) or indium zinc oxide (IZO), etc., and the second electrode can be a metal such as aluminum (Al), magnesium (Mg), silver (Ag), cobalt (Co), and gold (Au), etc., or can be an alloy of two or more of the metals that have been listed above.

According to some other embodiments, the display panel is a double-emitting display panel, and as such the substrate layer, the first electrode, and the second electrode are each configured to be transparent.

As such, the lights generated by and emitted from the light-emitting layer can directly transmit through the first electrode and the substrate layer to reach the outside from a bottom side of the display panel, and at the same time, the lights can also transmit through the second electrode to reach the outside from a top side of the display panel. Thereby the double-emission can be realized for the display panel.

Herein the substrate layer can comprise a glass, or a transparent plastic (e.g. polyethylene terephthalate), each of the first electrode and the second electrode can comprise a transparent electrode, such as indium tin oxide (ITO) or indium zinc oxide (IZO), etc.

It is noted that these above film layers of the display panel are also found in a conventional display panel, but the display panel disclosed herein comprises other film layers or structures which will be described below in detail.

In the following, the various embodiments of the disclosure are described in detail and illustrated in figures with a bottom-emitting QLED display panel as illustrating examples.

FIG. 1 illustrates a structural diagram of a bottom-emitting QLED display panel according to a conventional technology. As shown in the figure, the QLED display panel includes a substrate 201, a transparent electrode 202 (herein a transparent anode), a light-emitting layer 203 and a reflective electrode 204 (herein a cathode having a reflective surface at a side closer to the substrate 201). The transparent electrode 202, the light-emitting layer 203 and the reflective electrode 204 are sequentially disposed over the substrate 201.

Thus in this conventional bottom-emitting QLED display panel, the transparent electrode 202 is substantially comparable to the aforementioned first electrode of the display panel as disclosed herein, and the reflective electrode 204 is substantially comparable to the aforementioned second electrode of the display panel as disclosed herein.

Specifically in this conventional bottom-emitting QLED display panel, the substrate 201 comprises a glass substrate having a refractive index of ~1.5, the transparent electrode 202 has a refractive index of ~1.8, and the reflective electrode 204 comprises a metal, the light-emitting layer 203 comprises a plurality of organic or inorganic sub-layers including a hole injection sub-layer, a hole transport sub-layer, an electron blocking sub-layer, a quantum dot emitting sub-layer, a hole blocking sub-layer, an electron transport sub-layer, and an electron injection sub-layer.

It is noted that the detailed arrangement, configuration, and illustration of these different sub-layers in the light-emitting layer 203 is skipped, and only the light-emitting layer 203 is described and illustrated herein.

In this conventional bottom-emitting QLED display panel, a lot of propagating lights, after generation by the light-emitting layer 203 of the display panel, are being lost due to the waveguide effect (i.e. total internal reflection on the interface between the transparent electrode 202 (n=~1.8) and the substrate of glass 201 (n=~1.5)), and due to the substrate effect (i.e. total internal reflection on the interface between the substrate of glass 201 (n=~1.5) and air (not shown the figure, n=~1)).

The loss of light extraction in this conventional bottom-emitting QLED display panel is due primarily to a mismatch in refractive indices between corresponding media (i.e. between the transparent electrode 202 and the substrate 201, and between the substrate 201 and the air).

It has been calculated for this conventional bottom-emitting QLED display panel that increasing refractive index of the substrate 201 would result into significant reduction of losses to the waveguide effect, as shown in Table 1, and even to surface plasmon resonance (SPP).

Unfortunately, however, this results into higher losses to the substrate effect due to increased mismatch of refractive indices between air and the substrate 201 of a high refractive index (n). In addition, high-refractive index glass substrates are more fragile and expensive than normal glass.

TABLE 1

| Substrate | Direct Emission | Substrate Mode | Waveguide Mode | Surface Plasmons | Absorption |
| --- | --- | --- | --- | --- | --- |
| BK7 (n ≈ 1.5) | 19.2% | 19.4% | 36.1% | 22.0% | 3.2% |
| n = 1.8 | 19.2% | 43.6% | 4.3% | 26.9% | 6.0% |
| n = 2.0 | 19.0% | 59.3% | 0.0% | 5.6% | 16.1% |
| n = 2.2 | 18.7% | 62.0% | 0.0% | 2.4% | 16.9% |
| n = 2.4 | 18.3% | 62.6% | 0.0% | 1.6% | 17.5% |

In order to address the large mismatch of refractive indices between the transparent electrode 202 and the substrate 201 and/or the large mismatch of refractive indices between the substrate 201 and the air, a display panel having a multilayer graded refractive index substrate that can match the refractive index of a transparent electrode 202 on one side and of surrounding air on the other side is disclosed herein.

Figure 2:
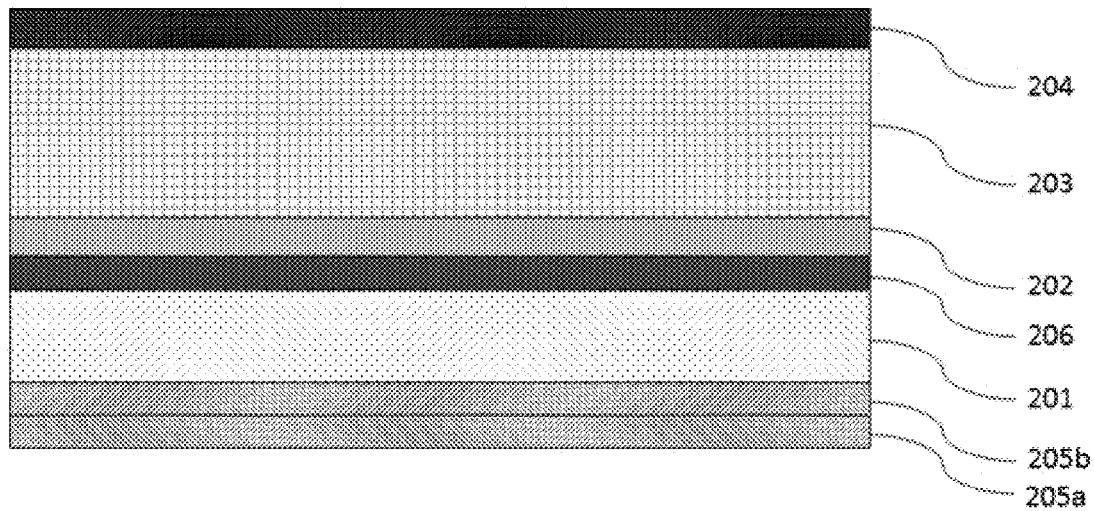
FIG. 2 illustrates a structural diagram of a bottom-emitting QLED display panel according to some embodiments of the disclosure.

FIG. 2 illustrates a structural diagram of the display panel according to some embodiments of the disclosure. As shown in the figure, the display panel disclosed herein is similar to the conventional bottom-emitting QLED display panel as illustrated in FIG. 1, but differs by arranging a first refractive film layer 206 between the substrate 201 and the transparent electrode 202.

The first refractive film layer 206 has a relatively high refractive index (for example, n=1.6-1.7), which is configured to be higher than the refractive index of the substrate 201 (n=~1.5) but lower than the refractive index of the transparent electrode 202 ((n=~1.8), such that a large portion of the lights emitted by and from the light-emitting layer 203 can be refracted at an interface between the transparent electrode 202 and the first refractive film layer 206.

In other words, by arranging a first refractive film layer 206 with a refractive index of about 1.6-1.7 between the substrate 201 and the transparent electrode 202 in the display panel, the total internal reflectance on the glass substrate 201-transparent electrode 202 interface in the conventional bottom-emitting QLED display panel as illustrated in FIG. 1 can be effectively reduced, which in turn can lead to a reduced loss of lights due to the waveguide effect.

Herein, the first refractive film layer 206 can be fabricated on top of the substrate 201 prior to the formation (or deposition) of the transparent electrode 202, and thus the first refractive film layer 206 and the substrate 201 substantially form a multilayered substrate layer having a graded refractive index (i.e., multilayered, graded refractive-index, substrate layer) in the display panel.

Specifically, the first refractive film layer 206 can have a composition of a polymer material having a refractive index between the substrate 201 (n=~1.5) and the transparent electrode 202 (n=~1.8). The polymer material can be, for example, polyamideimide, and the refractive index can be about 1.6-1.7.

Alternatively, the first refractive film layer 206 can comprise a composite material, such as optical silicone embedded with nanoparticles of $TiO_2$. The nanoparticles of $TiO_2$ can have a size of less than 5 nm. A refractive index of silicone is typically around 1.4-1.5, and by embedding optical silicone with $TiO_2$ nanoparticles, the refractive index can be increased.

It is noted that the employment of the composite material (i.e. optical silicone embedded with nanoparticles of $TiO_2$) allows for controlling the refractive index of the first refractive film layer 206 with flexibility and precision.

One of the ways to obtain such $TiO_2$ nanoparticles is utilizing hydrolysis of titanium isopropoxide with a slow hydrolysis rate under a careful control of the reaction conditions. In one example, the $TiO_2$ nanoparticles can be synthesized with a surfactant of trimethoxy(7-octen-1-yl) silane (i.e. a silane molecule terminated with a vinyl group), which will allow the particles to be incorporated directly into a silicone matrix. The vinyl termination group on the trimethoxy(7-octen-1-yl)silane ligands is identical to the termination group on many commercial optical silicones.

This allows the $TiO_2$ nanoparticles to disperse uniformly and crosslink directly into the silicone matrix. Depending on the concentration of the $TiO_2$ nanoparticles, the refractive index of the composite film (i.e. silicone containing nanoparticles of $TiO_2$) can be easily controlled in the range between 1.4 and 1.9.

Figure 3A:
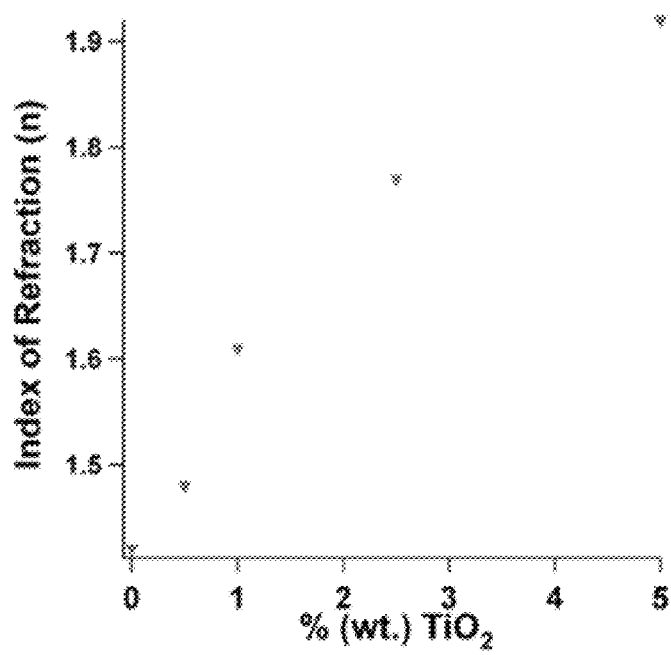
FIG. 3A illustrates a graph showing the refractive index of the TiO$_2$ nanoparticles/silicone composites used in the refrating film in the bottom-emitting QLED display panel as shown in FIG. 2 as a function of TiO$_2$ concentration in the solution used to form a film out of the composites.

FIG. 3A illustrates a graph showing a relationship between the refractive index of a composite film and the weight percentage of the $TiO_2$ nanoparticles. As shown in the figure, by altering the weight percentage of $TiO_2$ nanoparticles, the refractive index of the first refractive film layer 206 can be adjusted between around 1.4-1.9. If, for example, a weight percentage of nanoparticles of $TiO_2$ in silicone is around 5%, the refractive index of the composite film (i.e. silicone embedded with nanoparticles of $TiO_2$) can be increased to about 1.9.

Figure 3B:
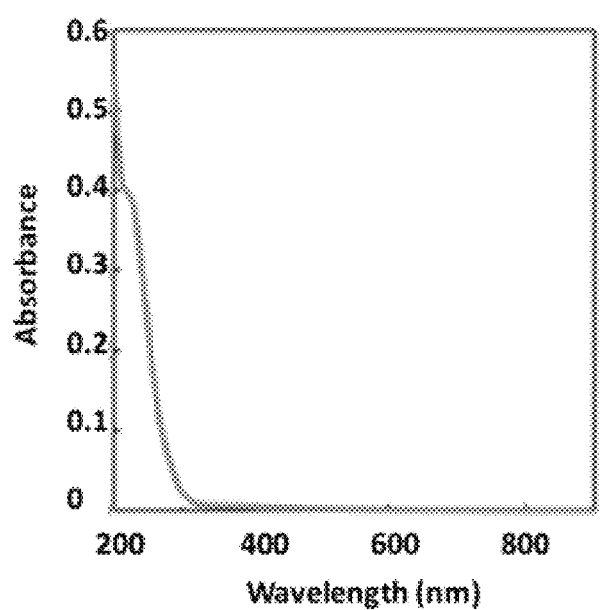
FIG. 3B illustrates a graph showing the absorption of lights with regard to different wavelengths by the TiO$_2$ nanoparticles/silicone composites used in the refrating film in the bottom-emitting QLED display panel as shown in FIG. 2.

In addition, as a consequence of the small size of the $TiO_2$ nanoparticles in the composite film, the $TiO_2$ nanoparticles do not scatter light with a wavelength >350 nm, as determined from their UV-vis absorption spectrum as shown in FIG. 3B, thus leaving the composites transparent in the visible wavelength range.

Figure 4:
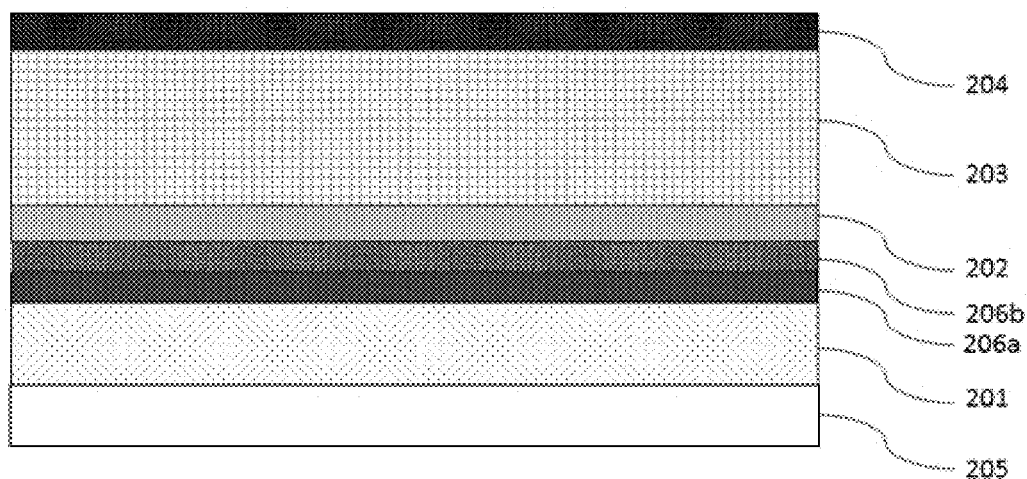
FIG. 4 illustrates a structural diagram of a bottom-emitting QLED display panel according to some other embodiments of the disclosure.

FIG. 4 illustrates a structural diagram of a bottom-emitting QLED display panel according to some other embodiments of the disclosure. As shown in FIG. 4, the first refractive film layer 206 includes a first refractive sub-layer 206a and a second refractive sub-layer 206b. The second refractive sub-layer 206b is between the first refractive sub-layer 206a and the transparent electrode 202.

It is further configured such that a refractive index of the first refractive sub-layer 206a is lower than a refractive index of the second refractive sub-layer 206b, but is higher than a refractive index of the substrate 201. As such, along the direction of light transmission in the bottom-emitting display panel as shown in FIG. 4, the transparent electrode 202, the second refractive sub-layer 206b, the first refractive sub-layer 206a, and the substrate 201 can respectively have a stepwise decreasing refractive index. In one specific embodiment of the display panel disclosed herein, the transparent electrode 202, the second refractive sub-layer 206b, the first refractive sub-layer 206a, and the substrate 201 can respectively have a refractive index of 1.8, 1.7, 1.6, and 1.5.

By such a configuration, when lights emitted from the light-emitting layer 203 transmit through the transparent electrode 202, the second refractive sub-layer 206b, the first refractive sub-layer 206a to reach the substrate 201, only a small portion of the light has a total internal reflectance at the interface between the transparent electrode 202 and the second refractive sub-layer 206b, and at the interface between the first refractive sub-layer 206a and the second refractive sub-layer 206b. Consequently, a large portion of the light can still get refracted through, thereby resulting into significant reduction of losses due to the waveguide effect, in turn leading to an increased light output for the display panel.

According to some embodiments where the transparent electrode 202 has a refractive index of ~1.8, the second refractive sub-layer 206b can be configured to have a refractive index of about 1.7-1.9. As such, the second refractive sub-layer 206b can have a composition of a polymer having a relatively high refractive index, which can be, for example, poly(dimethyl siloxane), or polyethylene naphthalate, etc. Alternatively, the second refractive sub-layer 206b can comprise an optical silicone that is embedded with nanoparticles of $TiO_2$ (having a weight percentage of about 2-5%). By altering the weight percentage of the $TiO_2$ nanoparticles, the refractive index of the second refractive sub-layer 206b can be adjusted to be around 1.7-1.9.

In addition, the first refractive sub-layer 206a can be configured to have a refractive index between the substrate 201 and the second refractive sub-layer 206b. According to some embodiments where the substrate 201 is glass and has a refractive index of about 1.5, the first refractive sub-layer 206a can have a refractive index of about 1.6-1.7. As such, the first refractive sub-layer 206a can comprise an optical silicone that is embedded with nanoparticles of $TiO_2$ having a weight percentage of about 1-2%.

It is noted that besides the bilayer structure for the first refractive film layer 206 as described in the above embodiment illustrated in FIG. 4, the first refractive film layer 206 can have a multilayer structure, and can thus include more than two sub-layers, stacked over one another between the transparent electrode 202 and the substrate 201.

The more than two sub-layers of the first refractive film layer 206 are configured such that the uppermost sub-layer has a refractive index lower than the transparent electrode 202, the lowermost sub-layer has a refractive index higher than the substrate 201, and each sub-layer has a refractive index higher than an adjacent sub-layer that is closer to the substrate 201. As such, the more than two sub-layers of the first refractive film layer 206 have a stepwise reduced refractive index in a direction from the transparent electrode 202 to the substrate 201.

In addition, the first refractive film layer 206 can also be configured to have a continuously reducing gradient of refractive index in a direction from the transparent electrode 202 to the substrate 201, and the refractive index of any sub-layer in the first refractive film layer 206 is between a refractive index of the transparent electrode 202 and a refractive index of the substrate 201.

It is further noted that in order to increase the amount of light emitted from the light-emitting layer 203 to reach the substrate 201, the first refractive film layer 206 can comprise a microlens array, disposed for example, in the second refractive sub-layer 206b of the first refractive film layer 206 as shown in FIG. 4. The micro-lens array can include a plurality of micro lenses, each configured to have a convex direction towards the substrate 201 to thereby allow focusing of lights transmitting therethrough.

As further shown in FIG. 4, the display panel further includes a second refractive film layer 205, arranged between the substrate 201 and the medium (e.g. air, not shown in the figure).

Specifically, the second refractive film layer 205 is disposed on a lower surface of the substrate 201 (i.e. on a surface of the substrate 201 that is closer to the medium or is farther away from the transparent electrode 202). The second refractive film layer 205 is configured to have a refractive index lower than the substrate 201 and higher than the medium.

By arranging the second refractive film layer 205 between the substrate 201 and the medium, when a light emitted from the light-emitting layer 203 transmits through the substrate to arrive at the medium, only a small portion of the light has a total internal reflectance at an interface between the substrate 201 and the second refractive film layer 205, and at an interface between the second refractive film layer 205 the medium. As such, a large portion of the light can still get refracted through, thereby resulting into significant reduction of losses due to the substrate effect, in turn leading to an increased light output for the display panel.

According to some embodiments, the second refractive film layer 205 can be an oblique-angle-deposited $SiO_2$ film. There is a correlation between an oblique deposition angle of a $SiO_2$ film and a refractive index of the $SiO_2$ film.

Figure 5A:
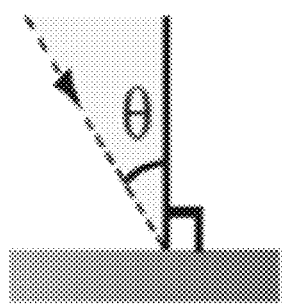
FIG. 5A and FIG. 5B respectively illustrate an angle of inclination (i.e. tilt angle) of a SiO$_2$ film deposited and a graph showing a relationship between the angle of inclination of a SiO$_2$ film deposited and the refractive index of the SiO$_2$ film.
Figure 5B:
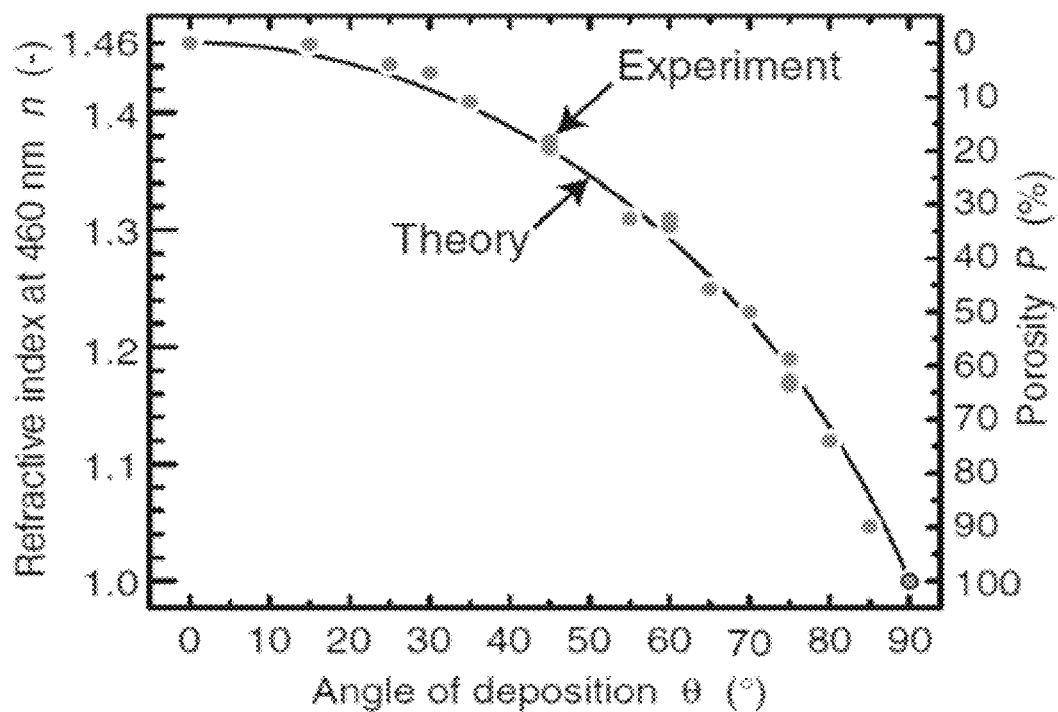

FIG. 5A illustrated an oblique-angle-deposited $SiO_2$ film over a surface, which has an oblique deposition angle θ with a direction perpendicular to the surface. FIG. 5B illustrates a graph showing a relationship between the angle of deposition of a $SiO_2$ film, a porosity of the $SiO_2$ film, and the refractive index of the $SiO_2$ film.

As shown in FIG. 5B, with an increasing oblique deposition angle of the $SiO_2$ film, its porosity increases, resulting into lower refractive index of porous $SiO_2$ compared to the bulk material. In other words, the higher the deposition angle (θ), the higher the porosity (P) of the film, and the lower the refractive index (n). It can be seen that by controlling the oblique deposition angle θ during deposition of the $SiO_2$ film we can control the $SiO_2$ porosity and with it its refractive index in the range from 1.46, corresponding to the normal incidence deposition, to 1.05, corresponding to the 85° oblique angle deposition.

According to one specific embodiment, the oblique-angle-deposited $SiO_2$ film (i.e. the second refractive film layer 205) is deposited in such a manner that a deposition angle thereof is continuously changing in a direction from closer to the substrate 201 to farther away from the substrate 201 during the deposition, which starts with close to 20° corresponding to about 5% porosity and refractive index n=~1.45 and ends up with close to 80° corresponding to about 80% porosity and refractive index n=~1.1. As such, the second refractive film layer 205 is substantially configured to have a continuous gradient of refractive index.

According to another specific embodiment as shown in FIG. 2, the second refractive film layer 205 has a substantially a bilayer structure, and specifically comprises a first $SiO_2$ film sub-layer 205b and a second $SiO_2$ film sub-layer 205a, along the transmission direction of lights.

The second $SiO_2$ film sub-layer 205a is arranged between the substrate 201 and the first $SiO_2$ film sub-layer 205b. The first $SiO_2$ film sub-layer 205b is configured to have a lower refractive index than the second $SiO_2$ film sub-layer 205a, by being deposited at a higher oblique angle than the second $SiO_2$ film sub-layer 205a. The first $SiO_2$ film sub-layer 205b also has a higher refractive index than the medium (e.g. air). As such, the bilayer structure of the second refractive film layer 205 substantially provides stepwise graded refractive index.

As such, when a light emitted from the light-emitting layer 203 reaches a first interface between the substrate 201 and the second $SiO_2$ film sub-layer 205a, only a small portion of the light is totally reflected at the first interface; when the light further reaches a second interface between the second $SiO_2$ film sub-layer 205a and the first $SiO_2$ film sub-layer 205b, only a small portion of the light is totally reflected at the second interface; and when the light further reaches a third interface between the first $SiO_2$ film sub-layer 205b and the medium, only a small portion of the light is totally reflected at the third interface. As such, a large portion of the light can still get refracted through, thereby resulting into significant reduction of losses due to the substrate effect, in turn leading to an increased light output for the display panel.

In one specific embodiment where the substrate 201 is glass (having a refractive index n of ~1.5), the refractive index of the first $SiO_2$ film sub-layer 205b can be around 1.3-1.4, corresponding to an oblique deposition angle of about 54°, and the refractive index of the second $SiO_2$ film sub-layer 205a can be around 1.1-1.2, corresponding to an oblique deposition angle of about 78°.

Figure 6:
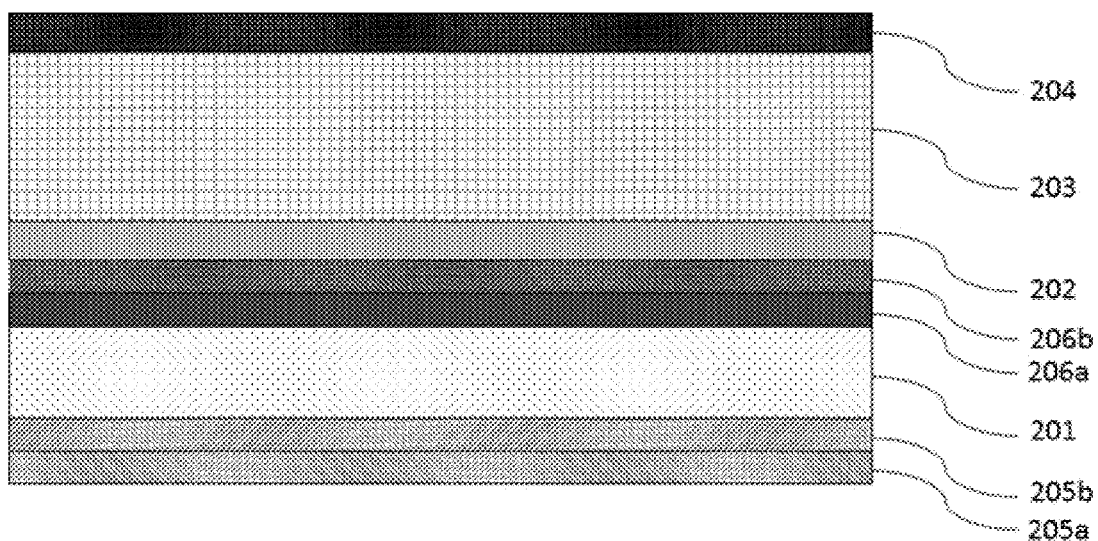
FIG. 6 illustrates a structural diagram of a bottom-emitting QLED display panel according to yet some other embodiments of the disclosure.

FIG. 6 illustrates a structural diagram of a bottom-emission QLED display panel according to yet some other embodiments of the disclosure. Specifically, in this embodiment of the display panel, the display panel includes a substrate 201, a transparent electrode 202, a light-emitting layer 203, and a reflective electrode 204.

A first refractive sub-layer 206a and a second refractive sub-layer 206b are disposed between the transparent electrode 202 and the substrate 201, which together substantially form the first refractive film layer 206 as described above. The first refractive sub-layer 206a is arranged between the substrate 201 the second refractive sub-layer 206b.

It is configured such that a refractive index of the second refractive sub-layer 206b is larger than that of the transparent electrode 202, but smaller than that of the first refractive sub-layer 206a, and that a refractive index of the first refractive sub-layer 206a is larger than that of the substrate 201. In other words, in a light-transmitting direction, the transparent electrode 202, the second refractive sub-layer 206b, the first refractive sub-layer 206a, and the substrate 201 are configured to have a stepwise reduced refractive index.

As such, when a light from the light-emitting layer 203 consecutively reaches a first interface between the transparent electrode 202 and second refractive sub-layer 206b, a second interface between the second refractive sub-layer 206b and the first refractive sub-layer 206a, and a third interface between the first refractive sub-layer 206a and the substrate 201, only a small portion of the light is reflected due to a total internal reflection at the first interface, at the second interface, and at the third interface, thereby resulting in a large portion of the light being still refracted through, leading to an improved light extraction for the display panel.

A first $SiO_2$ film sub-layer 205b and a second $SiO_2$ film sub-layer 205a are further disposed over a surface of the substrate 201 opposing to the transparent electrode 202, which together substantially form the second refractive film layer 205 as described above.

The second $SiO_2$ film sub-layer 205a is arranged between the substrate 201 and the first $SiO_2$ film sub-layer 205b, and the first $SiO_2$ film sub-layer 205b is configured have a lower refractive index than the second $SiO_2$ film sub-layer 205a, by being deposited at a higher oblique angle than the second $SiO_2$ film sub-layer 205a. In other words, in a light-transmitting direction of the display panel, the substrate 201, the second $SiO_2$ film sub-layer 205a, the first $SiO_2$ film sub-layer 205b, and the air are configured to have a stepwise reduced refractive index.

As such, when a light from the light-emitting layer 203 reaches a first interface between the substrate and the second $SiO_2$ film sub-layer 205a, a second interface between the second $SiO_2$ film sub-layer 205a and the first $SiO_2$ film sub-layer 205b, and a third interface between the first $SiO_2$ film sub-layer 205b and the air, only a small portion of the light is reflected due to a total internal reflection at the first interface, at the second interface, and at the third interface, thereby resulting in a large portion of the light is refracted out, leading to an improved light extraction for the display panel.

Figure 7A:
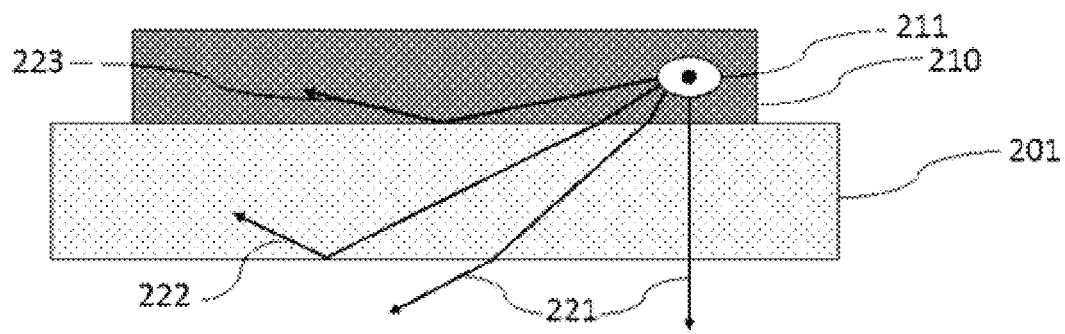
FIG. 7A illustrates a diagram of light emission of a conventional bottom-emitting QLED display panel.
Figure 7B:
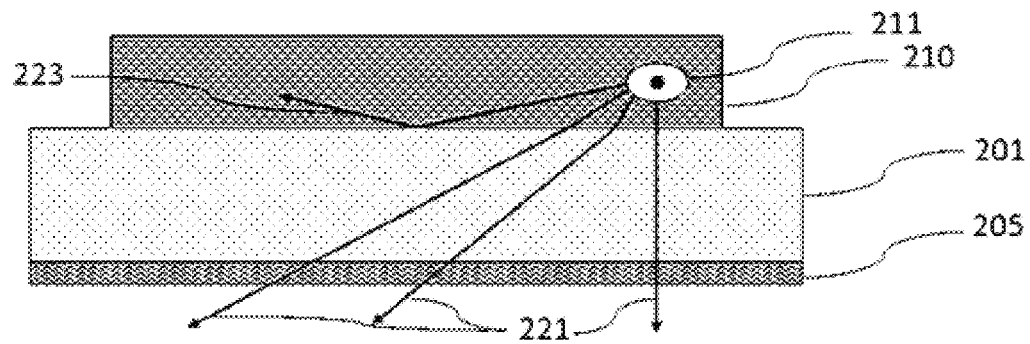
FIG. 7B illustrate a diagram of light emission of a bottom-emitting QLED display panel according to one embodiment of the disclosure.
Figure 7C:
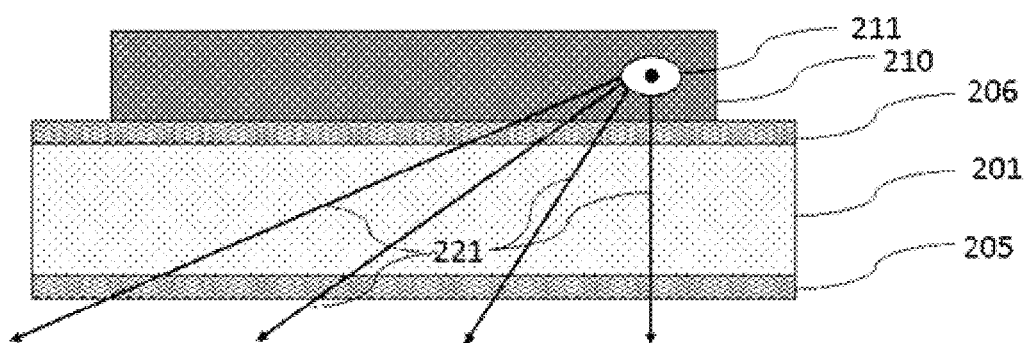
FIG. 7C illustrate a diagram of light emission of a bottom-emitting QLED display panel according to another embodiment of the disclosure.

FIG. 7A, FIG. 7B and FIG. 7C compares the diagrams of light emission within a conventional bottom-emitting QLED display panel, and within two different embodiments of the bottom-emitting QLED display panel disclosed herein.

As shown in FIG. 7A, the conventional bottom-emitting QLED display panel includes a transparent electrode 210, which contains emissive dipoles 211. Lights from the emissive dipoles 211 can be outcoupled out of the display panel (i.e. direct emission 221), reflected back from an interface 222 between the substrate 201 and the air (i.e. substrate effect), or reflected back from an interface 223 between the transparent electrode 210 and the substrate 201 (i.e. waveguide effect). As such, a relatively large portion of the lights are reflected back in this conventional QLED display panel.

FIG. 7B illustrate a diagram of light emission within one embodiment of the display panel. As shown in FIG. 7B, a $SiO_2$ film (i.e. a second refractive film layer 205) is arranged between the substrate 201 and the air (i.e. arranged over a surface of the substrate 201 opposing to the transparent electrode 210). By such an arrangement, at least a proportion of the lights from the emissive dipoles 211 that are reflected at the interface between the substrate 201 and the air can be outcoupled out of the display panel (i.e. direct emission 221), resulting in an improved light extraction rate for the display panel.

FIG. 7C illustrate a diagram of light emission within another embodiment of display panel. As shown in FIG. 7C, in addition to the $SiO_2$ film (i.e. the second refractive film layer 205) that is arranged between the substrate 201 and the air, a first refractive film layer 206 is further arranged between the substrate 201 and the transparent electrode 210. By such an arrangement, at least a first proportion of the lights from the emissive dipoles 211 that are reflected at the interface between the substrate 201 and the air can be outcoupled out of the display panel (i.e. direct emission 221), and furthermore, at least a second proportion of the lights that are reflected at the interface between the transparent electrode 210 and the substrate 201 can be outcoupled out of the display panel (i.e. direct emission 211), which together results in a significantly improved light extraction rate for the display panel, in turn leading to significant increase of device external quantum efficiency (EQE).

Figure 8:
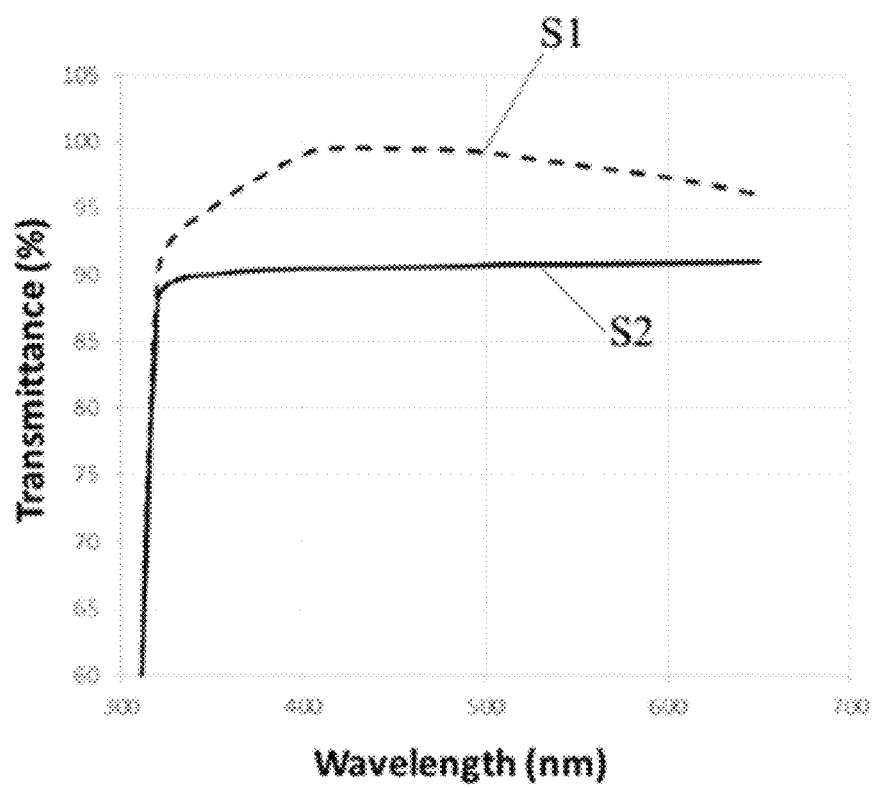
FIG. 8 is a graph illustrating a wavelength-dependent normal incidence transmittance of a substrate with graded refractive index in a display panel disclosed herein compared to a regular glass substrate.

FIG. 8 illustrates a light transmittance curve of a bottom-emitting display panel equipped with a substrate layer having a graded refractive index (i.e. graded index substrate layer) according to some embodiment of the disclosure compared to a conventional bottom-emitting QLED display panel having a regular glass substrate. S1 is a light transmittance curve for a display panel having a graded index substrate layer, and S2 is a light transmittance curve for a display panel having a regular glass substrate.

As shown in FIG. 8, the display panel having a regular glass substrate (i.e. the conventional display panel) shows around 91-92% transmittance across the visible spectra, while the display panel having a graded substrate layer reaches as high as 99% transmittance between 400 and 500 nm, while staying above 95% transmittance in the whole visible range. This shows that the graded index substrate layer exhibits very low reflectance compared with the regular glass substrate. As such, by utilizing a graded index substrate layer in a display panel (QLED or OLED), the need in specific anti-reflecting coatings in electroluminescent devices can also be negated.

In another aspect, the disclosure further provides a display apparatus.

The display apparatus includes a display panel according to any of the embodiments of the display panel as described above. The display apparatus can be a television, a monitor, a digital frame, a cellular phone, a tablet, or any other electronic devices or elements have a functionality of display.

In addition to the display panel, the display apparatus can also include a flexible circuit board, a printed circuit board, and a backboard.

In yet another aspect, the disclosure further provides a method for manufacturing a display panel.

Figure 9:
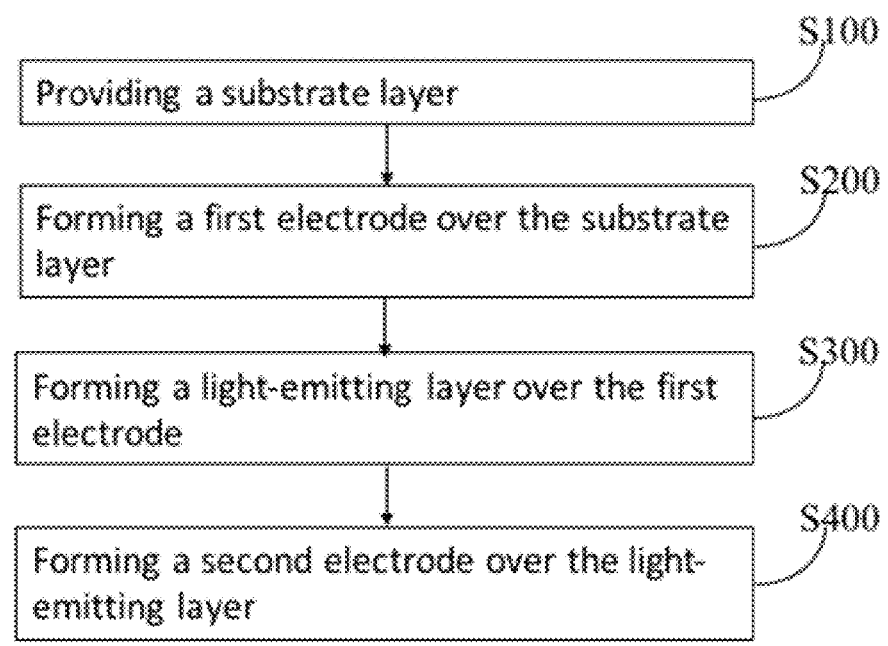
FIG. 9 illustrates a flow chart of the method for manufacturing a display panel.

Specifically, as illustrated in FIG. 9, the method for manufacturing the display panel comprises the following steps:

S100: providing a substrate layer; and
S200: forming a first electrode over the substrate layer;
S300: forming a light-emitting layer over the first electrode; and
S400: forming a second electrode over the light-emitting layer.

Herein the substrate layer and the first electrode are each configured to be transparent. The light-emitting layer can include an OLED light-emitting layer or alternatively include a QLED light-emitting layer. The first electrode and the second electrode can respectively be an anode and a cathode, or alternatively be a cathode and an anode.

Figure 10:
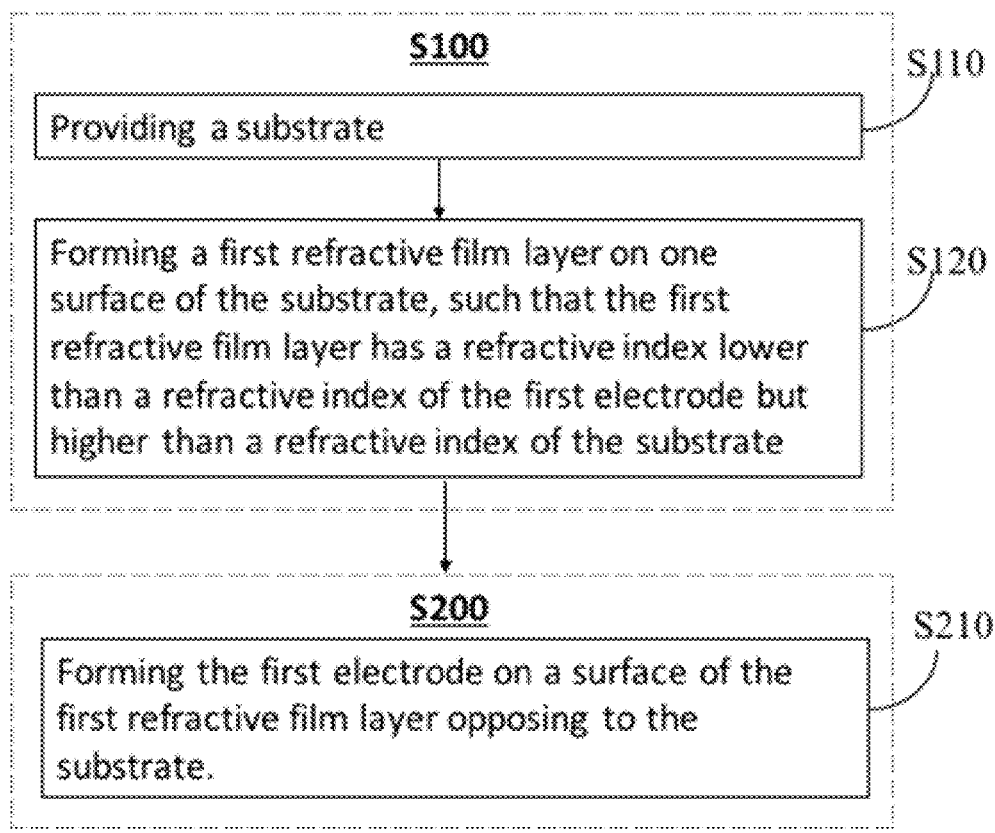
FIG. 10 illustrates a flow chart of the step S100 and S200 of the method for manufacturing a display panel as shown in FIG. 9 according to some embodiment of the disclosure.

According to some embodiments of the method, as shown in FIG. 10, the step S100 (i.e. providing a substrate layer) comprises the following sub-steps:

S110: providing a substrate;
S120: forming a first refractive film layer on one surface of the substrate, such that the first refractive film layer has a refractive index lower than a refractive index of the first electrode but higher than a refractive index of the substrate.

Accordingly, the step S200 (i.e. forming a first electrode over the substrate layer) comprises:

S210: Forming the first electrode on a surface of the first refractive film layer opposing to the substrate.

In the display panel manufactured by the method as described above, by configuring a first refractive film layer having the above-indicated refractive index between the substrate and the first electrode, when a light generated by and emitted from the light-emitting layer transmit through the first electrode and the first refractive film layer to reach an inside of the substrate, only a small proportion of the light is totally reflected (total internal reflection) at a first interface between the first electrode and the first refractive film layer, and at a second interface between the first refractive film layer and the substrate.

As such, a large proportion of the light can be outcoupled out to the inside of the substrate, resulting in a reduced waveguide effect and leading to an improved light extraction rate for the display panel.

Herein according to some embodiments, the substrate is glass (n=~1.5), and the transparent electrode has a refractive index of about 1.8. The first refractive film layer can have a composition of a polymer material (e.g. polyamideimide) having a refractive index between the substrate (n=~1.5) and the transparent electrode 202 (n=~1.8).

Alternatively, the first refractive film layer can comprise a composite material, such as optical silicone embedded with nanoparticles of $TiO_2$. The nanoparticles of $TiO_2$ can have a size of less than 5 nm. A refractive index of silicone is typically around 1.4-1.5, and by embedding optical silicone with $TiO_2$ nanoparticles, the refractive index can be increased.

Figure 11:
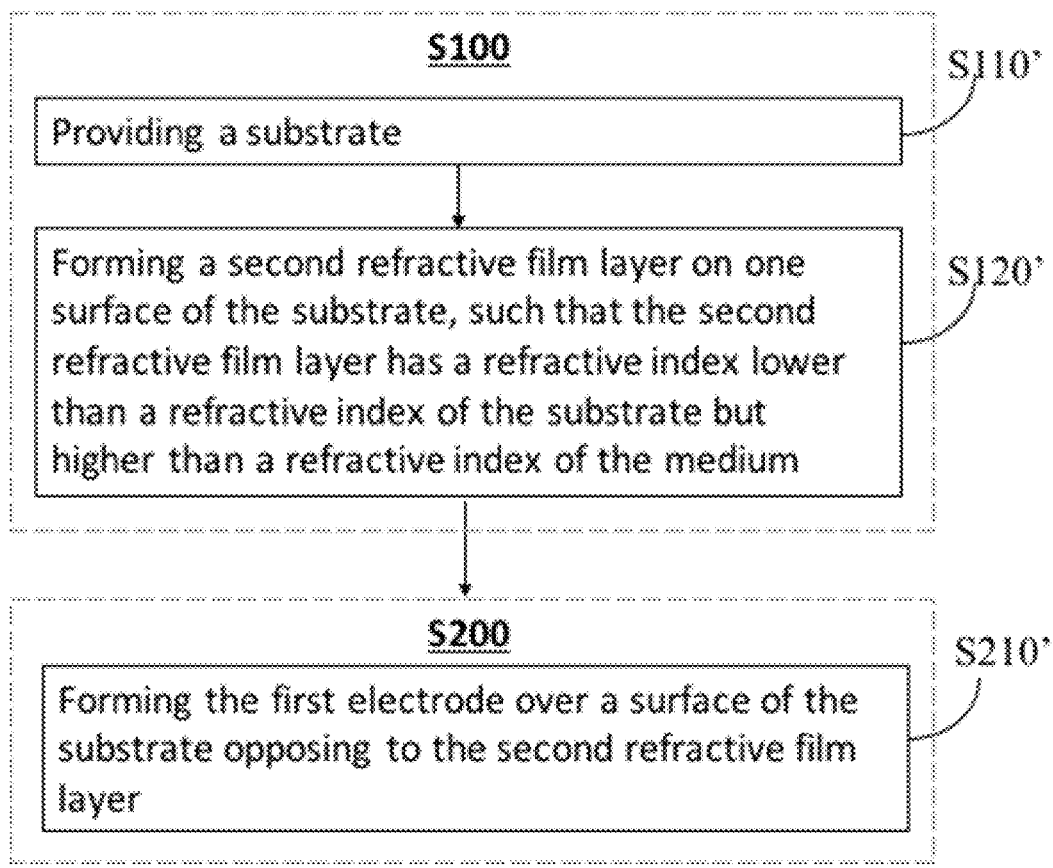
FIG. 11 illustrates a flow chart of the step S100 and S200 of the method for manufacturing a display panel as shown in FIG. 9 according to some other embodiments of the disclosure.

According to some other embodiments of the method as shown in FIG. 11, the step S100 (i.e. providing a substrate layer) comprises the following sub-steps:

S110': providing a substrate;

S120': forming a second refractive film layer on one surface of the substrate, such that the second refractive film layer has a refractive index lower than a refractive index of the substrate but higher than a refractive index of the medium.

Accordingly, the step S200 (i.e. forming a first electrode over the substrate layer) comprises:

S210': Forming the first electrode over a surface of the substrate opposing to the second refractive film layer.

Herein the second refractive film layer can comprise an oblique-angle-deposited $SiO_2$ film.

According to some embodiments of the method, the second refractive film layer is configured to have a continuous gradient of refractive index, and accordingly the sub-step S120' comprises:

Depositing a $SiO_2$ film on the surface of the substrate opposing to the second refractive film layer, such that a deposition angle thereof is continuously changing in a direction from farther away from the substrate to closer to the substrate during the deposition.

In one illustrating embodiment, the deposition angle starts with close to 20° corresponding to about 5% porosity and refractive index n=~1.45 and ends up with close to 80° corresponding to about 80% porosity and refractive index n=~1.1. As such, the second refractive film layer is substantially configured to have a continuous gradient of refractive index.

According to some other embodiments of the method, the second refractive film layer comprises a plurality of $SiO_2$ film sub-layers, and accordingly the sub-step S120' comprises:

Depositing the plurality of $SiO_2$ film sub-layers sequentially on the surface of the substrate opposing to the second refractive film layer such that each $SiO_2$ film sub-layer has a refractive index higher than an adjacent sub-layer that is closer to the substrate.

In one illustrating embodiment, the substrate is glass (n=~1.5), the medium is air (n=~1.0), and the second refractive film layer comprises two $SiO_2$ film sub-layers (a first $SiO_2$ film sub-layer and a second $SiO_2$ film sub-layer). The second $SiO_2$ film sub-layer is arranged between the substrate and the first $SiO_2$ film sub-layer.

The refractive index of the first $SiO_2$ film sub-layer can be around 1.1-1.2, corresponding to an oblique deposition angle of about 78°, and the refractive index of the second $SiO_2$ film sub-layer can be around 1.3-1.4, corresponding to an oblique deposition angle of about 54°. As such, the bilayer structure of the second refractive film layer substantially provides stepwise graded refractive index.

In the display panel manufactured by the method as described above, by configuring a second refractive film layer having the above-indicated refractive index between the substrate and the first electrode, when a light generated by and emitted from the light-emitting layer transmit through the substrate and the second refractive film layer to reach the air (i.e. outside of the display panel), only a small proportion of the light is totally reflected (total internal reflection) at a first interface between the substrate and the second refractive film layer, and at a second interface between the second refractive film layer and the air.

As such, a large proportion of the light can be outcoupled out to the inside of the substrate, resulting in a reduced waveguide effect and leading to an improved light extraction rate for the display panel.

According to some other embodiments of the method, the second refractive film layer comprises a first $SiO_2$ film sub-layer and a second $SiO_2$ film sub-layer. The second $SiO_2$ film sub-layer is arranged between the substrate and the first $SiO_2$ film sub-layer. The first $SiO_2$ film sub-layer is configured have a lower refractive index than the second $SiO_2$ film sub-layer, by being deposited at a higher oblique angle than the second $SiO_2$ film sub-layer.

Specifically, the refractive index of the first $SiO_2$ film sub-layer can be around 1.1-1.2, corresponding to an oblique deposition angle of about 78°, and the refractive index of the second $SiO_2$ film sub-layer can be around 1.3-1.4, corresponding to an oblique deposition angle of about 54°.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display panel, comprising:
   a substrate;
   a first electrode, a light-emitting layer, and a second electrode, sequentially disposed over the substrate; and
   one or more refractive film layers;
   wherein:
      the substrate, the first electrode, and the one or more refractive film layers are configured to provide a stepwise graded refractive index along a transmission direction of lights emitted from the light-emitting layer and transmitted therethrough to thereby cause an improved outcoupling of the lights; and
      the one or more refractive film layers comprise a second refractive film layer disposed on a surface of the substrate distal from the first electrode.

2. The display panel of claim 1, wherein the one or more refractive film layers further comprise a first refractive film layer disposed on a surface of the substrate proximal to the first electrode.

3. The display panel of claim 2, wherein:
   the first electrode comprises a transparent electrode having refractive index of about 1.8;
   the substrate comprises a glass having refractive index of about 1.5; and
   the first refractive film layer comprises a polymer material having a refractive index of about 1.5-1.8.

4. The display panel of claim 2, wherein:
   the first electrode comprises a transparent electrode having refractive index of about 1.8;
   the substrate comprises a glass having refractive index of about 1.5;
   the first refractive film layer comprises a composite material having a refractive index of about 1.5-1.8; and
   the composite material comprises optical silicone embedded with $TiO_2$ nanoparticles having a weight percentage of about 1-5% in the composite material.

5. The display panel of claim 4, wherein the second refractive film layer comprises at least one oblique-angle-deposited $SiO_2$ film layer having a deposition angle of about 0-85°.

6. The display panel of claim 5, wherein the second refractive film layer consists of one oblique-angle-deposited $SiO_2$ film layer, configured to have a continuously increasing deposition angle from 20° to 80° along the transmission direction of lights.

7. The display panel of claim 5, wherein the second refractive film layer comprises a plurality of oblique-angle-deposited $SiO_2$ film layers, stacked over one another, and configured such that any one oblique-angle-deposited $SiO_2$ film layer has a smaller deposition angle than an adjacent oblique-angle-deposited $SiO_2$ film layer along the transmission direction of lights.

8. The display panel of claim 2, wherein the first refractive film layer comprises a microlens array, wherein:
   the microlens array comprise a plurality of microlenses, each configured to have a convex direction towards the substrate to allow focusing of lights transmitting therethrough.

9. The display panel of claim 1, wherein at least one of the one or more refractive film layers comprises one or more refractive sub-layers, stacked over one another and configured to have a stepwise graded refractive index.

10. The display panel of claim 1, wherein at least one of the one or more refractive film layers is configured to have a continuously altering gradient of refractive index.

11. The display panel of claim 1, wherein:
   the substrate comprises a glass having refractive index of about 1.5; and
   the second refractive film layer has a refractive index of about 1.0-1.5.

12. A display apparatus, comprising a display panel according to claim 1.

13. A display panel, comprising:
   a substrate;
   a first electrode, a light-emitting layer, and a second electrode, sequentially disposed over the substrate; and
   one or more refractive film layers;
   wherein:
   the substrate, the first electrode, and the one or more refractive film layers are configured to provide a stepwise graded refractive index along a transmission direction of lights emitted from the light-emitting layer and transmitted therethrough to thereby cause an improved outcoupling of the lights;
      wherein the one or more refractive film layers comprise:
      a first refractive film layer, disposed on a surface of the substrate proximal to the first electrode; and
      a second refractive film layer, disposed on a surface of the substrate distal to the first electrode.

14. The display panel of claim 13, wherein at least one of the one or more refractive film layers comprises one or more refractive sub-layers, stacked over one another and configured to have a stepwise graded refractive index.

15. The display panel of claim 13, wherein at least one of the one or more refractive film layers is configured to have a continuously altering gradient of refractive index.

16. A method for manufacturing a display panel, comprising:
   providing a substrate;
   forming a first electrode over the substrate;
   forming a light-emitting layer over the first electrode;
   forming a second electrode over the light-emitting layer; and
      forming one or more refractive film layers, such that the substrate, the first electrode, and the one or more refractive film layers provide a stepwise graded refractive index along a transmission direction of lights emitted from the light-emitting layer and transmitted therethrough to thereby cause an improved outcoupling of the lights;
      wherein the forming one or more refractive film layers comprises:
      forming a second refractive film layer on a surface of the substrate distal to the first electrode, such that the first electrode, the substrate and the second refractive film layer provide a stepwise decreasing refractive index along the transmission direction of the lights emitted from the light-emitting layer.

17. The method of claim 16, wherein the forming one or more refractive film layers comprises:
   forming a first refractive film layer on a surface of the substrate proximal to the first electrode prior to the forming a first electrode over the substrate, such that the first electrode, the first refractive film layer and the substrate provide a stepwise decreasing refractive index along the transmission direction of the lights emitted from the light-emitting layer.

18. The method of claim 16, wherein the substrate comprises a glass having refractive index of about 1.5, and the forming a second refractive film layer on a surface of the substrate distal to the first electrode comprises:

forming at least one oblique-angle-deposited SiO$_2$ film layer on the surface of the substrate distal to the first electrode, wherein each of the at least one oblique-angle-deposited SiO$_2$ film layer has a deposition angle of about 0-85°.

19. The method of claim 18, wherein the forming at least one oblique-angle-deposited SiO$_2$ film layer on the surface of the substrate distal to the first electrode comprises:
forming one oblique-angle-deposited SiO$_2$ film layer having a continuously increasing deposition angle from 20° to 80° along the transmission direction of lights.

20. The method of claim 18, wherein the forming at least one oblique-angle-deposited SiO$_2$ film layer on the surface of the substrate distal to the first electrode comprises:
forming each of a plurality of oblique-angle-deposited SiO$_2$ film layers sequentially on the surface of the substrate distal to the first electrode, such that any oblique-angle-deposited SiO$_2$ film layer has a smaller deposition angle than an adjacent oblique-angle-deposited SiO$_2$ film layer along the transmission direction of lights.

* * * * *